United States Patent
Chen

(10) Patent No.: US 8,249,667 B2
(45) Date of Patent: Aug. 21, 2012

(54) WIRELESS COMMUNICATION TERMINAL AND BATTERY CAPACITANCE MEASURING METHOD THEREOF

(75) Inventor: Chun-Liang Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 550 days.

(21) Appl. No.: 12/470,471

(22) Filed: May 21, 2009

(65) Prior Publication Data
US 2010/0093408 A1  Apr. 15, 2010

(30) Foreign Application Priority Data
Oct. 10, 2008  (CN) ................. 2008 1 0304888

(51) Int. Cl.
*H04B 1/38* (2006.01)
(52) U.S. Cl. ............... 455/572; 455/573; 455/574
(58) Field of Classification Search ........... 455/572–574
See application file for complete search history.

(56) References Cited

U.S. PATENT DOCUMENTS

| | | | |
|---|---|---|---|
| 2004/0220758 A1* | 11/2004 | Barsoukov et al. | 702/63 |
| 2007/0188145 A1* | 8/2007 | Kim et al. | 320/132 |
| 2007/0243850 A1* | 10/2007 | Arai | 455/343.1 |

FOREIGN PATENT DOCUMENTS

| | | |
|---|---|---|
| CN | 1641372 A | 7/2005 |
| CN | 1956287 A | 5/2007 |
| JP | 2007244142 A | 9/2007 |
| TW | I222826 | 10/2004 |
| TW | I226738 | 1/2005 |
| TW | 200824169 | 6/2008 |

* cited by examiner

*Primary Examiner* — Dwayne Bost
*Assistant Examiner* — Yungsang Lau
(74) *Attorney, Agent, or Firm* — Altis Law Group, Inc.

(57) ABSTRACT

A wireless communication terminal includes a battery module, a monitor module, a battery-capacitance update module, and a display module. The monitor module detects a working state of the wireless communication terminal including idle and communication states, periodically detects and records a voltage of the battery module, calculates dynamic average voltages of the battery module in the idle and communication states, and subtracts the dynamic average voltages in the idle and communication states to calculate a dynamic voltage compensation of the battery module in the communication state. The battery-capacitance update module includes a timer, and detects a voltage of the battery module after the timer has timed out, compensates the detected voltage with the dynamic voltage compensation when in the communication state, and reads battery capacitance of the battery module according to the compensated voltage. The display module displays the battery capacitance.

16 Claims, 3 Drawing Sheets

WIRELESS COMMUNICATION TERMINAL AND BATTERY CAPACITANCE MEASURING METHOD THEREOF

BACKGROUND

1. Technical Field

The invention relates to wireless communication, and particularly to a wireless communication terminal and battery capacitance measuring method thereof.

2. Description of Related Art

Wireless communication terminals, such as mobile phones and portable computers, have become increasingly popular and feature a growing number of functionalities. However, to incorporate such varied functions, more power is often consumed, such that battery management is very important in the design of wireless communication terminals.

When the battery capacitance of wireless communication terminals is low, the wireless communication terminals will manage and limit the consumption of power from certain applications to avoid further loss of power. In addition, wireless communication terminals continuously display their current battery capacitance level, allowing users to charge the battery accordingly.

However, when wireless communication terminals are in an operational state with a high current consumption, measurement of battery voltage may be inaccurate, resulting in an inaccurate battery capacitance.

DETAILED DESCRIPTION

Figure 1:
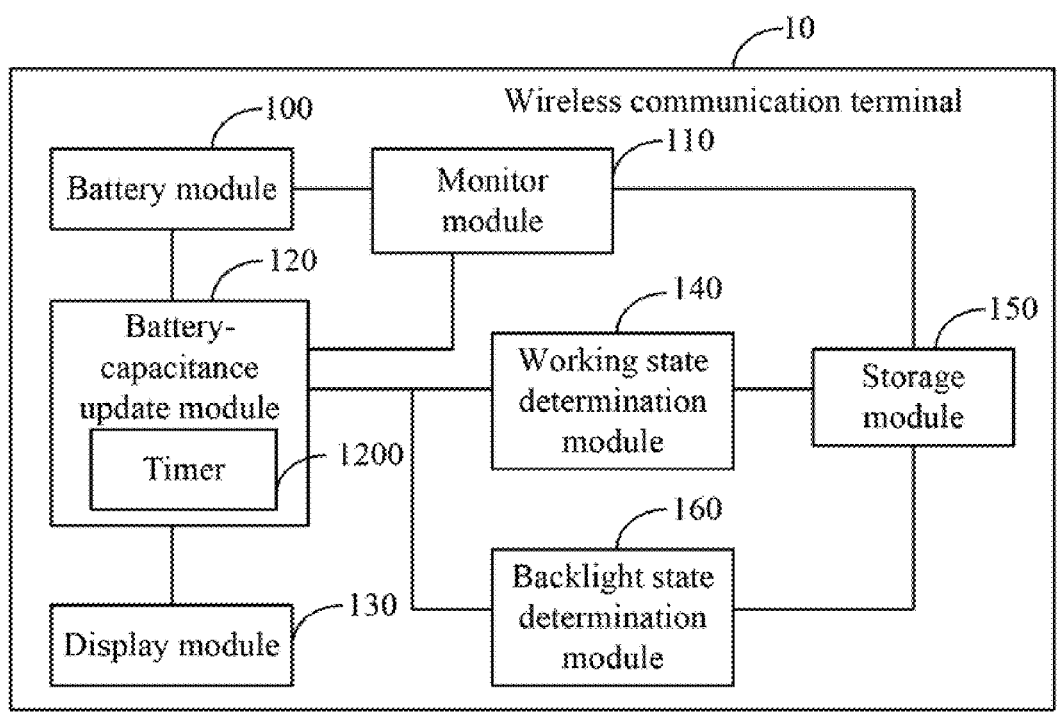
FIG. 1 is a schematic diagram of one embodiment of a wireless communication terminal as disclosed.

FIG. 1 is a schematic diagram of one embodiment of a wireless communication terminal 10 as disclosed. The wireless communication terminal 10 includes a battery module 100, a monitor module 110, a battery-capacitance update module 120, and a display module 130. The battery module 100 provides power to the wireless communication terminal 10. In one embodiment, the wireless communication terminal 10 may be a mobile phone, a personal digital assistant, or a portable computer.

The monitor module 110 detects a working state of the wireless communication terminal 10, periodically detects and records a voltage of the battery module 100, and calculates dynamic average voltages of the battery module 100 of the working state. The working states may include an idle state and a communication state. The monitor module 100 further subtracts the dynamic average voltages of the battery module 100 in the idle and communication states to calculate a dynamic voltage compensation of the battery module 100 in the communication state. In one example, the communication state may refer to the wireless communication terminal 10 in communication with another wireless communication terminal and the idle state may refer to the wireless communication terminal not in communication with another wireless communication terminal.

In one embodiment, the monitor module 110 continuously detects and records voltage of the battery module 110, and continuously calculates an average voltage between a predetermined time window T, which is a positive integer, according to the recorded voltage. The predetermined time window T is ten seconds in the idle state, and thirty seconds in the communication state, in one embodiment. It is appreciated that the monitor module 110 detects the voltage of the battery module 110 via other time frequencies, and the predetermined time window in the two working state may be changed.

The average voltage at a time t is calculated according to the following formula: $Va(t)=(V(t-T+1)+V(t-T+2)+ \ldots +V(t-1)+V(t))/T$, and the time t is equal to or greater than T and is variable. The dynamic average voltage in the working state is an average voltage calculated at the end of the corresponding working state or at the time that the battery capacitance of the battery module 100 needs to be updated. According to the above example, the predetermined time window T is equal to ten seconds in the idle state, and the time t is no less than ten seconds. Thus, in the idle state, an average voltage at the tenth second $Va(10)=(V1+V2+ \ldots +V9+V10)/10$, an average voltage at the eleventh second $Va(11)=(V2+V3+ \ldots +V10+V11)/10$, and so on.

The battery-capacitance update module 120 includes a timer 1200. The battery-capacitance update module 120 detects a voltage of the battery module 100 after the timer 1200 times out, and compensates the detected voltage with the dynamic voltage compensation of the battery module 100 when the wireless communication terminal 10 is in the communication state. The battery-capacitance update module 120 further reads battery capacitance of the battery module 10 according to the compensated voltage. In one embodiment, the battery-capacitance update module 120 further stores a voltage-capacitance relationship between voltages and battery capacitance of the battery module 100, and reads the battery capacitance of the battery module 10 according to the compensated voltage and the voltage-capacitance relation. The monitor module 110 further retriggers the timer 1200 when the wireless communication terminal 10 enters the communication state from the idle state, to ensure accurate measurement of voltage of the battery module 100.

In one embodiment, after the wireless communication terminal 10 has been in communication state for one hundred twenty seconds, the voltage of the battery module 100 becomes fixed, so the monitor module 110 treats a dynamic voltage compensation calculated at the 120th second as a dynamic voltage compensation after the 120th second. That is, if the wireless communication terminal 10 has been in the communication state for one hundred forty seconds, a dynamic voltage compensation at the 140th second is equal to the dynamic voltage compensation calculated at the 120th second.

The display module 130 displays the battery capacitance of the battery module 100. In one embodiment, the display module 130 displays the battery capacitance of the battery module 100 via battery bars or percentage.

The wireless communication terminal 10 further includes a working state determination module 140, a storage module 150, and a backlight state determination module 160. The storage module 150 stores the working state and a backlight state of the wireless communication terminal 10. The working state determination module 140 determines the working state of the wireless communication terminal 10 after the timer 1200 times out according to the working state stored in the storage module 150. In one embodiment, the monitor module 110 determines the working state according to the working state in the storage module 150.

The backlight state determination module 160 determines the backlight state of the wireless communication terminal 10 after the timer 1200 times out according to the backlight state in the storage module 150. The wireless communication terminal 10 sets the backlight state in the storage module 150 according to events turning the backlight on and off. The battery-capacitance update module 120 further compensates the detected voltage with a fixed voltage compensation when the backlight is on.

Figure 2:
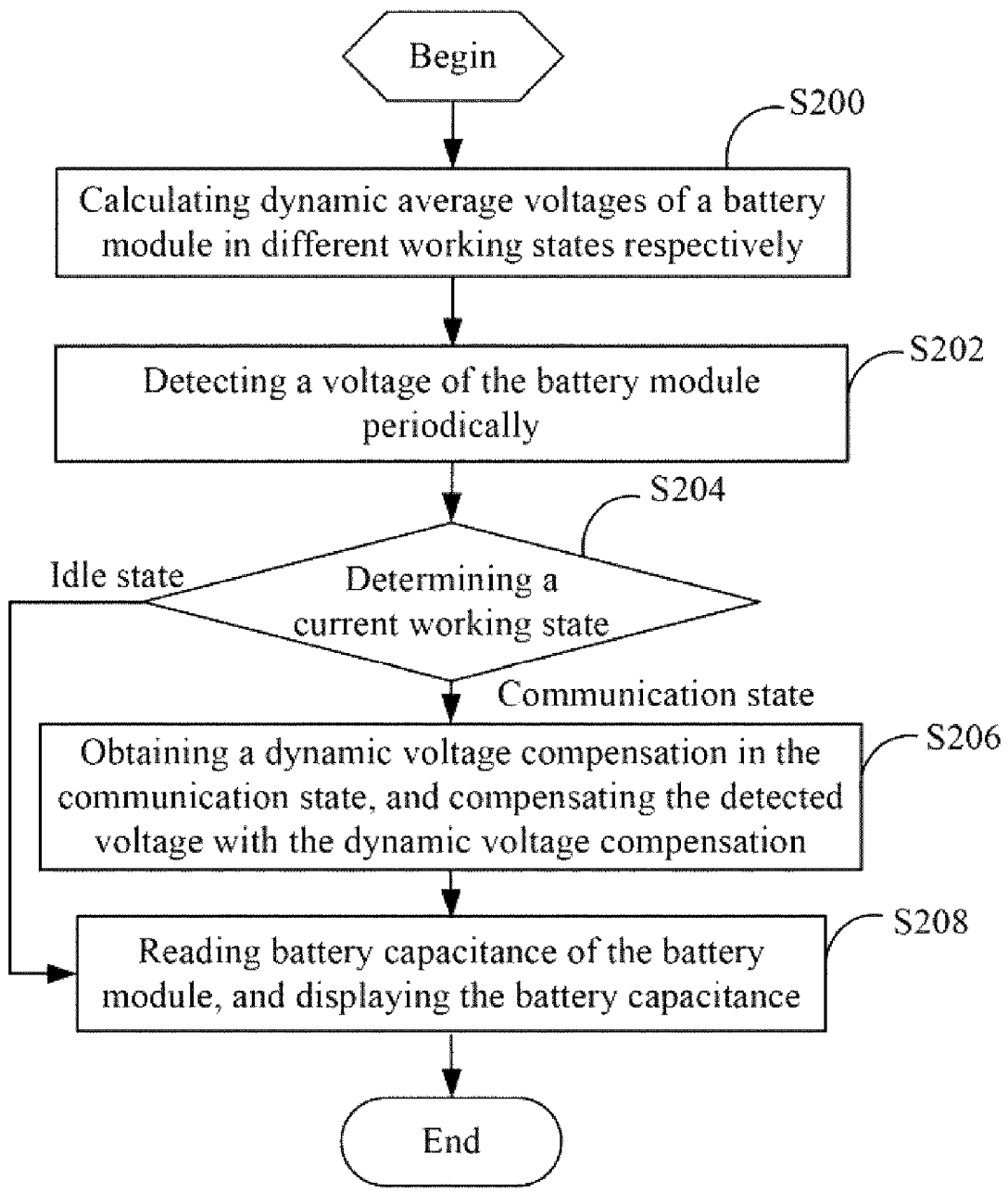
FIG. 2 is a flowchart illustrating a first embodiment of a battery capacitance measuring method as disclosed.

FIG. 2 is a flowchart of a first embodiment of a battery capacitance measuring method for utilization in a wireless communication terminal as disclosed, such as, for example, the wireless communication terminal 10 of FIG. 1. In block S200, the wireless communication terminal 10 is powered on, and the monitor module 110 periodically detects and records a voltage of the battery module 100, and calculates dynamic average voltages of the battery module 100 in different working states of the wireless communication terminal 10. In one embodiment, according to the recorded voltage, the monitor module 110 continuously calculates an average voltage Va(t) between a predetermined time window T in the different working states according to the following formula: Va(t)=(V(t−T+1)+V(t−T+2)+ . . . +V(t−1)+V(t))/T, until the end of the corresponding working state or the time that the battery capacitance of the battery module 100 needs to be updated. The monitor module 110 treats an average voltage calculated at the end of the working state or at the time that the battery capacitance of the battery module 100 needs to be updated as the dynamic average voltage in the corresponding working state. As noted above, the predetermined time window T is a positive integer, and the time t is equal to or greater than T and is variable.

In block S202, the battery-capacitance update module 120 periodically detects a voltage of the battery module 100. In block S204, the working state determination module 140 determines a current working state of the wireless communication terminal 10. If in the communication state, in block S206, the monitor module 110 subtracts the dynamic average voltages of the battery module 100 in the idle and communication states to obtain a dynamic voltage compensation of the battery module 100 in the communication state, and the battery-capacitance update module 120 compensates the detected voltage with dynamic voltage compensation. In one embodiment, the dynamic voltage compensation is calculated according to the average voltage calculated ten seconds before the end of the idle state and an average voltage calculated thirty seconds before an end of the communication state. If in the idle state, the dynamic voltage compensation is not calculated, the detected voltage is not compensated, and block S206 is implemented.

In block S208, the battery-capacitance update module 120 reads battery capacitance of the battery module 10 according to the detected voltage or the compensated voltage, and the display module 130 displays the battery capacitance.

Figure 3:
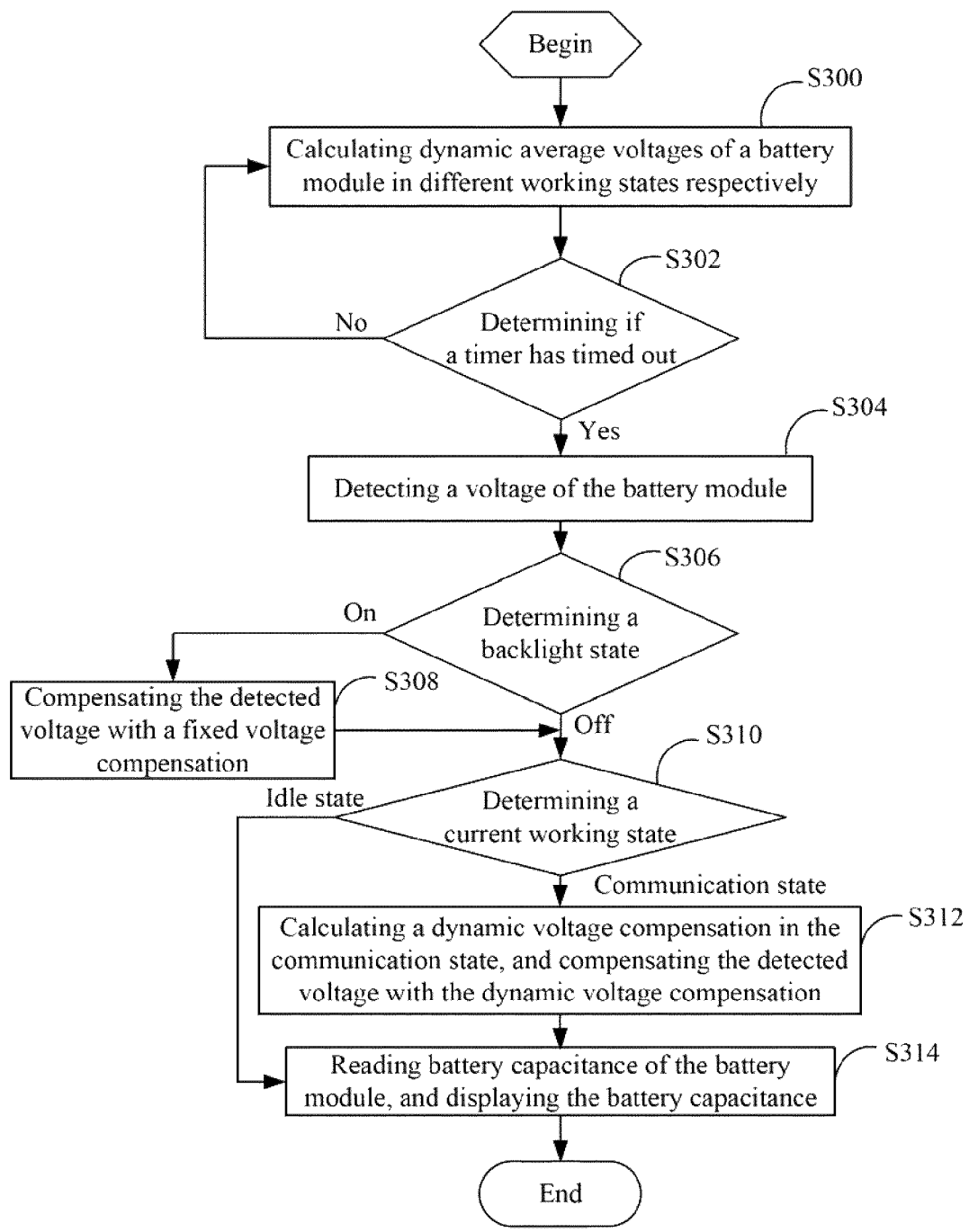
FIG. 3 is a flowchart illustrating a second embodiment of a battery capacitance measuring method as disclosed.

FIG. 3 is a flowchart of a second embodiment of a battery capacitance measuring method for utilization in a wireless communication terminal as disclosed, such as, for example, the wireless communication terminal 10 of FIG. 1. In block S300, the wireless communication terminal 10 is powered on, and the monitor module 110 periodically detects and records a voltage of the battery module 100, and calculates dynamic average voltages of the battery module 100 in different working states of the wireless communication terminal 10, such as the idle and communication states. In one embodiment, the dynamic average voltages in the different working states are calculated between a different predetermined time window using a method as explained above.

In block S302, it is determined if the timer 1200 has timed out. If the timer 1200 has not timed out, timing continues, and the block S302 is repeated.

If the timer 1200 has timed out, in block S304, the battery-capacitance update module 120 detects a voltage of the battery module 100. In block S306, the backlight state determination module 160 determines a backlight state of the wireless communication terminal 10.

If the backlight of the wireless communication terminal 10 is on, in block S308, the battery-capacitance update module 120 compensates the detected voltage with a fixed voltage compensation. In one embodiment, the fixed voltage compensation compensates for a voltage of the battery module 100 when the backlight is on, and is predetermined.

In block S310, the working state determination module 140 determines a current working state of the wireless communication terminal 10. If in the communication state, in block S312, the monitor module 110 subtracts the dynamic average voltages of the battery module 100 in the idle and communication states to calculate a dynamic voltage compensation of the battery module 100 in the communication state, and the battery-capacitance update module 120 compensates the detected voltage with dynamic voltage compensation. In one embodiment, the dynamic voltage compensation is calculated according to the average voltage calculated ten seconds before the end of the idle state and an average voltage is calculated thirty seconds before an end of the communication state. If in the idle state, the dynamic voltage compensation is not calculated, the detected voltage is not compensated, and block S314 is implemented.

In block S314, the battery-capacitance update module 120 detects battery capacitance of the battery module 10 according to the detected voltage or the compensated voltage, and the display module 130 displays the battery capacitance.

In one embodiment, sequences of blocks S306, S308 and S310, S312 can be changed.

The wireless communication terminal 10 determines if the wireless communication terminal 10 is in the communication state, and if in the communication state, calculates a dynamic voltage compensation to compensate a detected voltage, to ensure accurate measurement of voltage and battery capacitance of the battery module 10. Thus, the battery capacitance in the communication state is fixed, avoiding erroneous detection.

The foregoing disclosure of various embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto and their equivalents.

What is claimed is:
1. A wireless communication terminal, comprising:
   a battery module to provide power to the wireless communication terminal;
   a monitor module to:
      detect a working state of the wireless communication terminal, wherein the working state comprises an idle state and a communication state;
      periodically detect and record a voltage of the battery module;
      calculate dynamic average voltages of the battery module when the wireless communication terminal is in the idle state and the communication state; and
      subtract the dynamic average voltages of the battery module when the wireless communication terminal is in the idle state and the communication state, to calculate a dynamic voltage compensation of the battery module when the wireless communication terminal is in the communication state;

wherein the monitor module continuously calculates an average voltage Va(t) between a predetermined time window T in the different working states according to a formula of Va(t)=(V(t−T+1)+V(t−T+2)+ . . . +V(t−1)+V(t))/T, until the end of the corresponding working state or the time that the battery capacitance of the battery module needs to be updated, and treats an average voltage calculated at the end of the corresponding working state or at the time that the battery capacitance of the battery module needs to be updated as the dynamic average voltage in the corresponding working state;

a battery-capacitance update module comprising a timer, wherein the battery-capacitance update module detects a voltage of the battery module after the timer times out, compensates the detected voltage with the dynamic voltage compensation of the battery module when the wireless communication terminal is in the communication state, and reads battery capacitance of the battery module according to the compensated voltage; and a display module to display the battery capacitance of the battery module.

2. The wireless communication terminal of claim 1, wherein the monitor module retriggers the timer when the wireless communication terminal enters the communication state from the idle state.

3. The wireless communication terminal of claim 1, further comprising a storage module storing the working state and a backlight state of the wireless communication terminal.

4. The wireless communication terminal of claim 3, further comprising a backlight state determination module to determine the backlight state of the wireless communication terminal after the timer times out.

5. The wireless communication terminal of claim 4, wherein the battery-capacitance update module further compensates the detected voltage with a fixed voltage compensation when the backlight is on.

6. The wireless communication terminal of claim 4, wherein the backlight state determination module determines the backlight state of the wireless communication terminal according to the backlight state in the storage module.

7. The wireless communication terminal of claim 3, further comprising a working state determination module to determine the working state of the wireless communication terminal after the timer times out.

8. The wireless communication terminal of claim 7, wherein the working state determination module determines the working state of the wireless communication terminal according to the working state in the storage module.

9. The wireless communication terminal of claim 1, wherein the battery-capacitance update module further stores a voltage-capacitance relationship between voltages and battery capacitance of the battery module.

10. The wireless communication terminal of claim 1, wherein the predetermined time window T is a positive integer, and the time t is equal to or greater than T and is variable.

11. A battery capacitance measuring method for utilization in a wireless communication terminal comprising a battery module, comprising:

continuously calculating an average voltage Va(t) between a predetermined time window T in the different working states of the wireless communication terminal comprising idle and communication states respectively according to a formula of Va(t)=(V(t−T+1)+V(t−T+2)+ . . . +V(t−1)+V(t))/T, until the end of the corresponding working state or the time that the battery capacitance of the battery module needs to be updated;

treating an average voltage calculated at the end of the working state or at the time that the battery capacitance of the battery module needs to be updated as the dynamic average voltage in the corresponding working state;

detecting a voltage of the battery module periodically and determining a current working state of the wireless communication terminal;

subtracting the dynamic average voltages of the battery module when the wireless communication terminal is in the idle and communication states to obtain a dynamic voltage compensation of the battery module when the wireless communication terminal is in the communication state, and compensating the detected voltage with the dynamic voltage compensation if the wireless communication terminal is in the communication state;

reading battery capacitance of the battery module according to the compensated voltage; and displaying the battery capacitance of the battery module.

12. The battery capacitance measuring method of claim 11, wherein the predetermined time window T is a positive integer, and the time t is equal to or greater than T and is variable.

13. The battery capacitance measuring method of claim 11, wherein determination of a current working state of the wireless communication terminal comprises determining the current working state of the wireless communication terminal according to a working state stored in a storage module.

14. The battery capacitance measuring method of claim 11, wherein detection of a voltage of the battery module periodically comprises:

determining if a timer has timed out; and detecting the voltage of the battery module upon the condition that the timer has timed out.

15. The battery capacitance measuring method of claim 14, further comprising determining a backlight state of the wireless communication terminal after the timer has timed out; and compensating the detected voltage with a fixed voltage compensation when the backlight of the wireless communication terminal is on.

16. The battery capacitance measuring method of claim 14, further comprising retriggering the timer when the wireless communication terminal enters the communication state from the idle state.

* * * * *